(12) United States Patent
Jacob et al.

(10) Patent No.: US 8,963,259 B2
(45) Date of Patent: Feb. 24, 2015

(54) DEVICE ISOLATION IN FINFET CMOS

(71) Applicant: GlobalFoundries Inc., Grand Cayman (KY)

(72) Inventors: Ajey P. Jacob, Albany, NY (US); Murat K. Akarvardar, Saratoga Springs, NY (US); Steven J. Bentley, Watervliet, NY (US); Toshiharu Nagumo, Kanagawa (JP); Kangguo Cheng, Schenectady, NY (US); Bruce B. Doris, Slingerlands, NY (US); Ali Khakifirooz, Mountain View, CA (US)

(73) Assignees: GlobalFoundries Inc., Grand Cayman (KY); International Business Machines Corporation, Armonk, NY (US); Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/906,852

(22) Filed: May 31, 2013

(65) Prior Publication Data

US 2014/0353801 A1   Dec. 4, 2014

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 21/761* | (2006.01) |
| *H01L 29/06* | (2006.01) |
| *H01L 21/762* | (2006.01) |

(52) U.S. Cl.
CPC .......... *H01L 21/761* (2013.01); *H01L 29/0646* (2013.01); *H01L 21/76224* (2013.01)
USPC ..... 257/401; 257/328; 257/331; 257/E29.001

(58) Field of Classification Search
USPC ........................... 257/328, 331, 401, E29.001
See application file for complete search history.

(56) References Cited

U.S. PATENT DOCUMENTS

| | | | |
|---|---|---|---|
| 7,009,250 B1 | 3/2006 | Mouli | |
| 7,235,468 B1 * | 6/2007 | Mouli | 438/514 |
| 7,388,259 B2 | 6/2008 | Doris et al. | |
| 8,053,299 B2 | 11/2011 | Xu | |
| 8,183,646 B2 | 5/2012 | Chau et al. | |
| 8,609,480 B2 * | 12/2013 | Xie | 438/197 |
| 8,665,629 B2 * | 3/2014 | Park et al. | 365/148 |
| 8,691,640 B1 * | 4/2014 | Licausi et al. | 438/156 |
| 8,759,194 B2 * | 6/2014 | Gauthier et al. | 438/403 |
| 8,790,979 B2 * | 7/2014 | Sudo | 438/283 |
| 8,802,510 B2 * | 8/2014 | Chang et al. | 438/151 |
| 8,815,684 B2 * | 8/2014 | Cai et al. | 438/268 |
| 8,878,260 B2 * | 11/2014 | Anderson et al. | 257/288 |
| 2006/0084212 A1 * | 4/2006 | Anderson et al. | 438/197 |
| 2007/0218635 A1 * | 9/2007 | Seliskar | 438/268 |
| 2012/0280250 A1 | 11/2012 | Basker et al. | |
| 2013/0082354 A1 * | 4/2013 | Yin et al. | 257/607 |
| 2014/0113420 A1 * | 4/2014 | Sargunas et al. | 438/231 |

* cited by examiner

*Primary Examiner* — Ida M Soward
(74) *Attorney, Agent, or Firm* — Williams Morgan, P.C.

(57) ABSTRACT

Embodiments herein provide approaches for device isolation in a complimentary metal-oxide fin field effect transistor. Specifically, a semiconductor device is formed with a retrograde doped layer over a substrate to minimize a source to drain punch-through leakage. A set of replacement fins is formed over the retrograde doped layer, each of the set of replacement fins comprising a high mobility channel material (e.g., silicon, or silicon-germanium). The retrograde doped layer may be formed using an in situ doping process or a counter dopant retrograde implant. The device may further include a carbon liner positioned between the retrograde doped layer and the set of replacement fins to prevent carrier spill-out to the replacement fins.

3 Claims, 14 Drawing Sheets

DEVICE ISOLATION IN FINFET CMOS

BACKGROUND

1. Technical Field

This invention relates generally to the field of semiconductors, and more particularly, to approaches for device isolation in a complementary metal-oxide field effect transistor.

2. Related Art

A typical integrated circuit (IC) chip includes a stack of several levels or sequentially formed layers of shapes. Each layer is stacked or overlaid on a prior layer and patterned to form the shapes that define devices (e.g., fin field effect transistors (FINFETs)) and connect the devices into circuits. In a typical state of the art complementary insulated gate FINFET process, such as what is normally referred to as CMOS, layers are formed on a wafer to form the devices on a surface of the wafer. Further, the surface may be the surface of a silicon layer on a silicon on insulator (SOI) wafer. A simple FINFET includes a gate layer rectangle on a silicon island formed from the silicon surface layer. Each of these layers of shapes, also known as mask levels or layers, may be created or printed optically through well known photolithographic masking, developing and level definition, e.g., etching, implanting, deposition, etc.

Silicon based FinFETs have been successfully fabricated using conventional MOSFET technology. A typical FinFET is fabricated on a substrate with an overlying insulating layer with a thin 'fin' extending from the substrate, for example, etched into a silicon layer of the substrate. The channel of the FET is formed in this vertical fin. A single or double gate is provided over the fin(s). A double gate is beneficial in that there is a gate on both sides of the channel allowing gate control of the channel from both sides. Further advantages of FinFETs include reducing the short channel effect and higher current flow. Other FinFET architectures may include three or more effective gates.

It is currently known that performance improvement in a bulk finFET can be increased by adding high mobility channel materials. Germanium based devices (Ge-Fin FET) include a fin formed at least in part, of germanium. Typical Ge-FinFET fabrication includes patterning a germanium layer on a substrate to form a narrow Ge-fin. However, even high mobility channel materials like Ge have aggravated junction leakage if the device interface is not properly engineered. As shown by the prior art device 10 of FIG. 1, the bulk FinFET suffers from punch-through leakage along the fin channel, which significantly contributes to overall device leakage. Furthermore, prior art device 10 is highly susceptible to damage during punch-through implant, and suffers from carrier spill-out to the undoped fin channel, which lowers the carrier mobility. Accordingly, what is needed is a solution to at least one of these deficiencies.

SUMMARY

In general, embodiments herein provide approaches for device isolation in a complimentary metal-oxide-semiconductor (CMOS) fin field effect transistor (finFET). Specifically, a semiconductor device is formed with a retrograde doped layer over a substrate to minimize a source to drain punch-through leakage. A set of replacement fins is formed over the retrograde doped layer, each of the set of replacement fins comprising a high mobility channel material (e.g., silicon, or silicon-germanium). The retrograde doped layer may be formed using an in situ doping process or a counter dopant retrograde implant. The device may further include a carbon liner positioned between the retrograde doped layer and the set of replacement fins to prevent carrier spill-out to the replacement fins.

One aspect of the present invention includes a semiconductor device comprising: a retrograde doped layer formed over a substrate, the retrograde doped layer comprising one of: doped silicon (Si), and doped silicon-germanium (Si—Ge); and a set of replacement fins formed over the retrograde doped layer, each of the set of replacement fins comprising a high mobility channel material.

Another aspect of the present invention includes a method for forming a fin field effect transistor, the method comprising: forming a retrograde doped layer over a substrate, the retrograde doped layer comprising one of: doped silicon (Si), and doped silicon-germanium (Si—Ge); and forming a set of replacement fins over the retrograde doped layer, each of the set of replacement fins comprising a high mobility channel material.

Another aspect of the present invention includes a method for providing device isolation in a complementary metal-oxide-semiconductor fin field effect transistor, the method comprising: forming a retrograde doped layer over a substrate, the retrograde doped layer comprising one of: doped silicon (Si), and doped silicon-germanium (Si—Ge); and forming a set of replacement fins over the retrograde doped layer, each of the set of replacement fins comprising at least one of: Si, and Si—Ge.

BRIEF DESCRIPTION OF THE DRAWINGS

These and other features of this invention will be more readily understood from the following detailed description of the various aspects of the invention taken in conjunction with the accompanying drawings in which.

Figure 1:
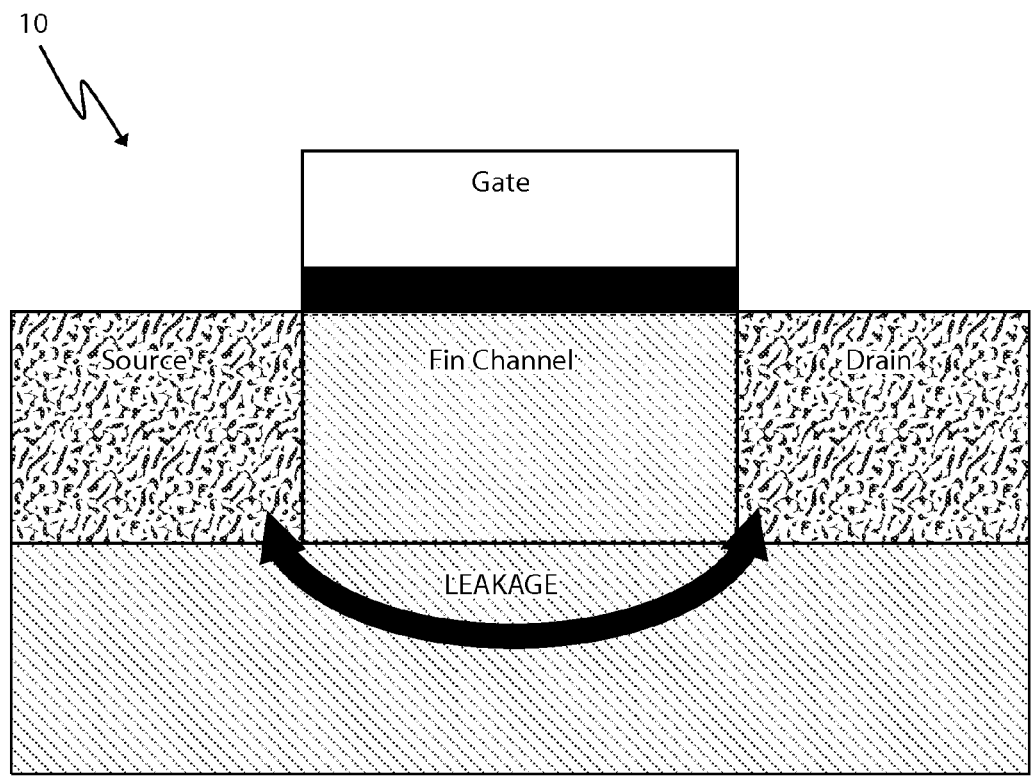
FIG. 1 shows a cross-sectional view of a prior art semiconductor device.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments will now be described more fully herein with reference to the accompanying drawings, in which exemplary embodiments are shown. Described are approaches for device isolation in a complementary metal-oxide finFET (e.g., a bulk finFET). Specifically, a semiconductor device is formed with a retrograde doped layer over a substrate to minimize a source to drain punch-through leakage. A set of replacement fins is formed over the retrograde doped layer, each of the set of replacement fins comprising a high mobility channel material (e.g., silicon, or silicon-germanium). The retrograde doped layer may be formed using an in situ doping process or a counter dopant retrograde implant. The device may further include a carbon liner positioned between the retrograde doped layer and the set of replacement fins to prevent carrier spill-out to the replacement fins.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 2:
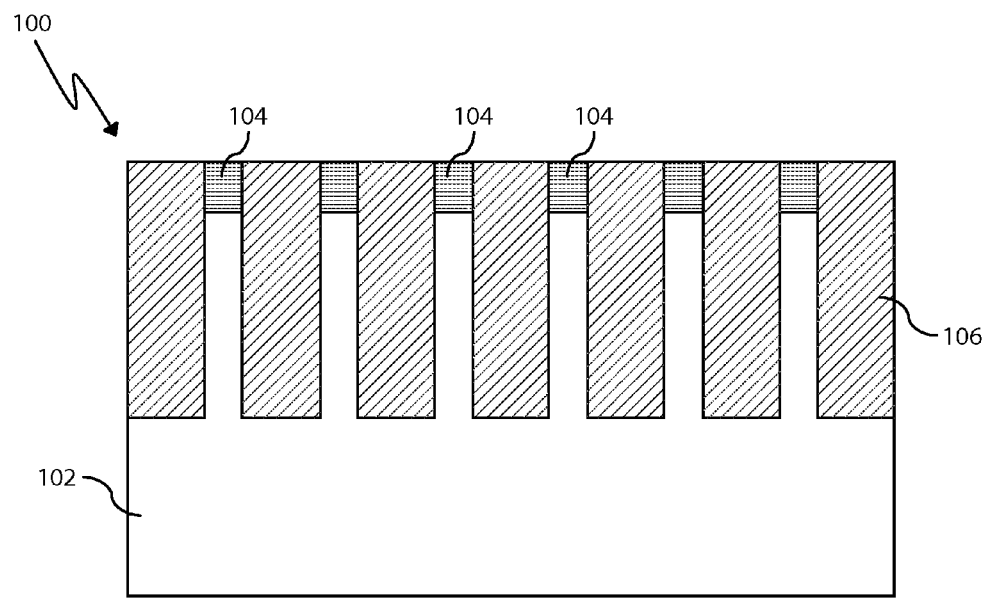
FIG. 2 shows a cross-sectional view of a plurality of fins formed in a device according to illustrative embodiments.

With reference again to the figures, FIG. 2 shows a cross sectional view of a device 100 according to an embodiment of the invention. Device 100 comprises a substrate 102 and plurality of fins 104 formed thereon. Device 100 further comprises a source trench isolation (STI) layer 106 disposed between each of fins 104. In one embodiment, substrate 102 includes a silicon substrate (e.g., wafer). Substrate 102 may be silicon in a crystalline structure (e.g., a bulk silicon substrate). STI layer 106 may include any suitable insulating material.

Fins 104 may be fabricated using any suitable process including one or more photolithography and etch processes.

The photolithography process may include forming a photoresist layer (not shown) overlying substrate 102 (e.g., on a silicon layer), exposing the resist to a pattern, performing post-exposure bake processes, and developing the resist to form a masking element including the resist. The masking element may then be used to etch fins 104 into the silicon layer, e.g., using reactive ion etch (RIE) and/or other suitable processes.

In one embodiment, fins 104 are formed by a double-patterning lithography (DPL) process. DPL is a method of constructing a pattern on a substrate by dividing the pattern into two interleaved patterns. DPL allows enhanced feature (e.g., fin) density. Various DPL methodologies may used including, double exposure (e.g., using two mask sets), forming spacers adjacent features and removing the features to provide a pattern of spacers, resist freezing, and/or other suitable processes.

Figure 3:
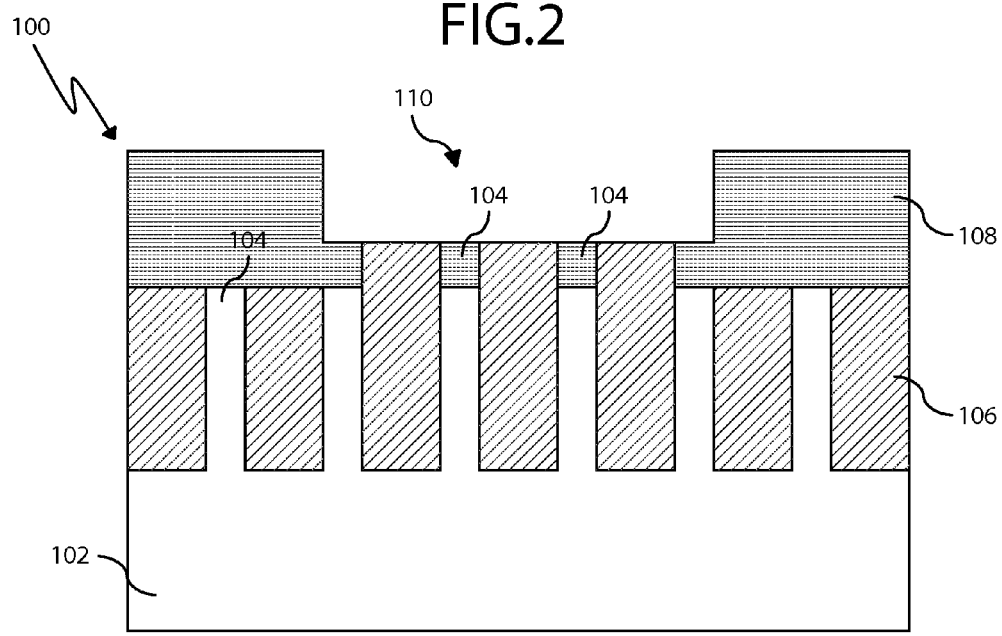
FIG. 3 shows a cross-sectional view of an opening in a hardmask formed over the plurality of fins according to illustrative embodiments.

Next, as shown in FIG. 3, a hard mask 108 is formed over fins 104, and an opening 110 is patterned therein. To accomplish this, opening 110 is patterned, for example, using a photo-lithography processes or other lithographic process (e.g., electron beam lithography, imprint lithography, etc.), and removed by a suitable etching process including a wet etch, dry etch, plasma etch, and the like. In one embodiment, hard mask 108 comprises SiN or SiO2.

Figure 4:
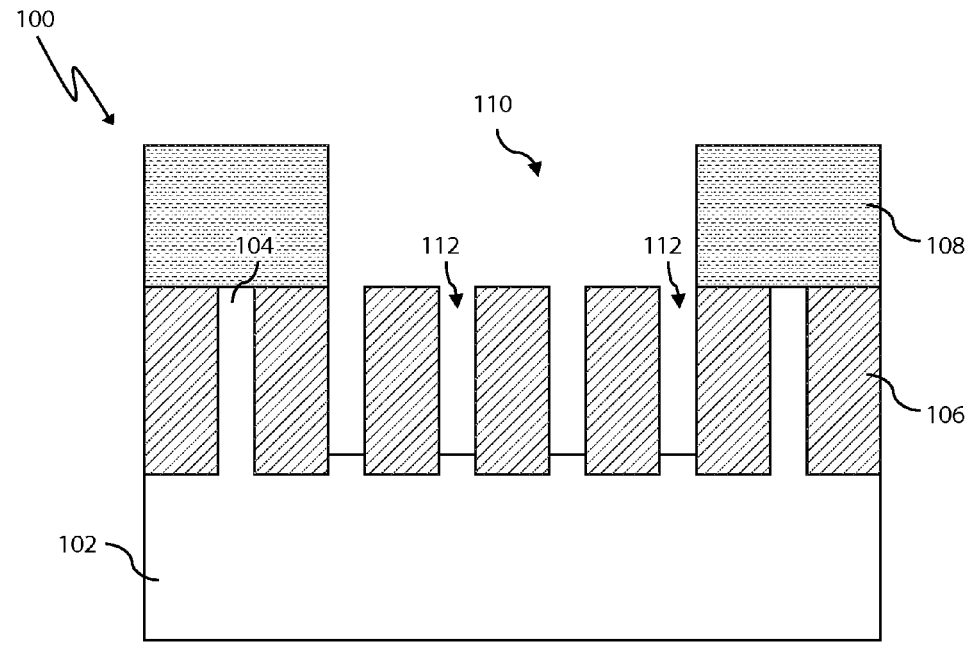
FIG. 4 shows a cross-sectional view of the removal of one or more of the plurality of fins according to illustrative embodiments.
Figure 5:
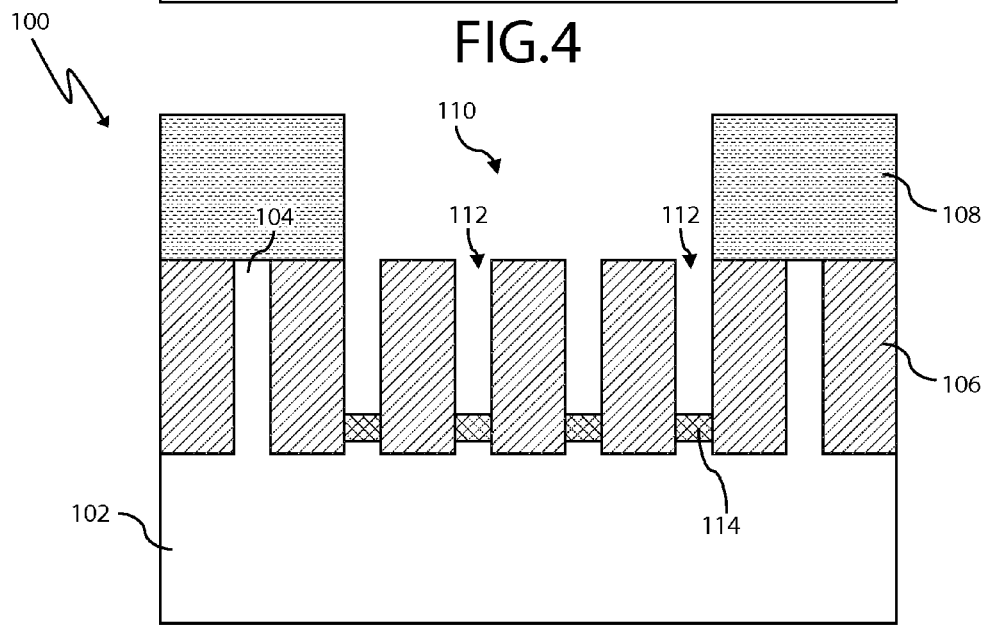
FIG. 5 shows a cross-sectional view of the formation of a retrograde doped layer over a substrate according to illustrative embodiments.

Next, as shown in FIG. 4, one or more of fins 104 exposed by opening 110 in hard mask 108 are then removed. In this embodiment, the exposed fins 104 are removed to form a set of openings 112 in STI layer 106. The exposed fins 104 may be removed by a suitable etching process including a wet etch, dry etch, plasma etch, and the like. A retrograde doped layer 114 is then grown within each of openings 112 and doped using an in situ doping process, resulting in the structure shown in FIG. 5. In this embodiment, retrograde doped layer 114 comprises Si or Si—Ge, and is grown by a CMOS compatible process, e.g., CVD. In alternative embodiments, retrograde doped layer 114 comprises doped N+Silicon/SiC Silicon layers (for PMOS), doped P+Silicon/SiC silicon layers (for NMOS), doped N+SiGe/SiGeC layers (for PMOS), or doped P+SiGe/SiGeC (for NMOS). In these embodiments, the Silicon NMOS may be strained as well. Retrograde doped layer 114 is doped using an in-situ doping technique wherein dopants are introduced to the Si/Si—Ge at the same time the Si/Si—Ge is being deposited. In one embodiment, the Si/Si—Ge of retrograde doped layer 114 is counter doped, e.g., with arsenic, antimony, or phosphorous, to ensure proper isolation.

Figure 6:
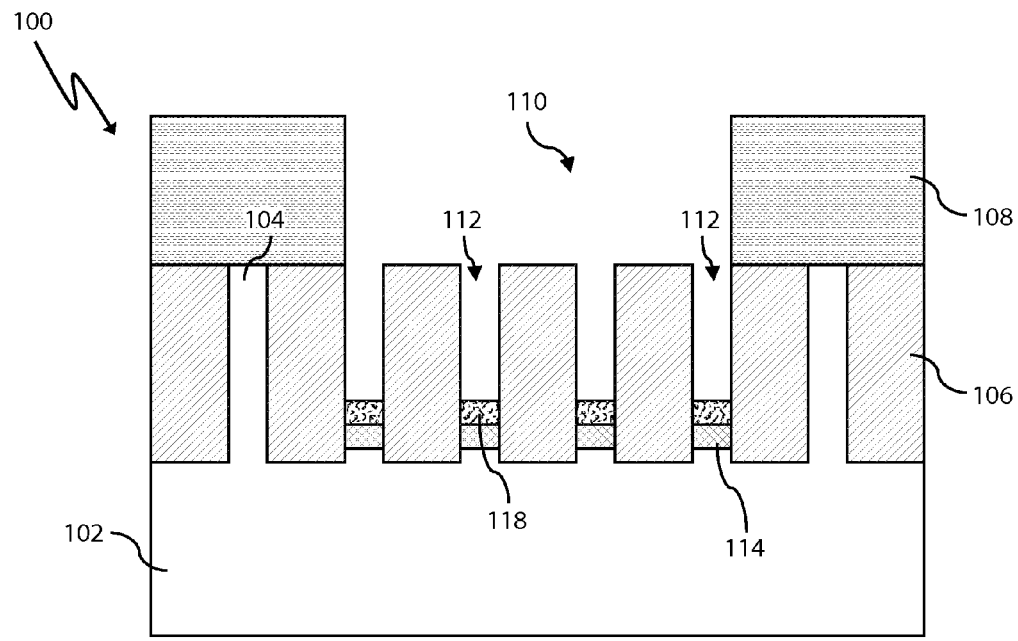
FIG. 6 shows a cross-sectional view of a carbon liner formed over the retrograde doped layer according to illustrative embodiments.
Figure 7:
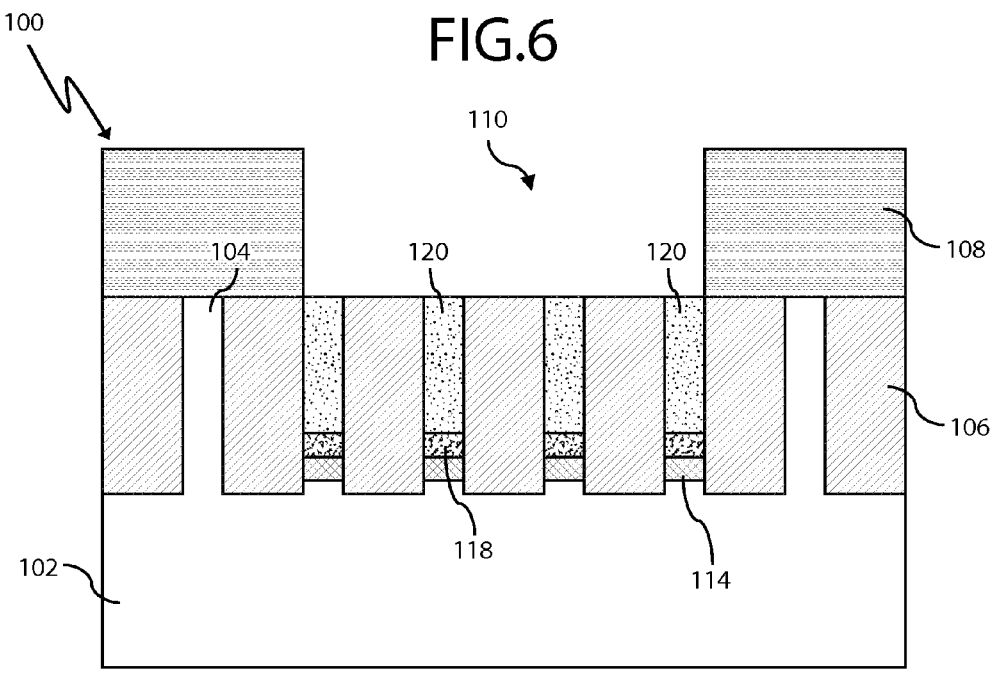
FIG. 7 shows a cross-sectional view of a set of replacement fins formed over the retrograde doped layer and the carbon liner according to illustrative embodiments.

As shown in FIG. 6, device 100 further comprises a carbon liner 118 formed over retrograde doped layer 114 within openings 112 in STI layer 106. In one embodiment, carbon liner 118 comprises Silicon Germanium:Carbon (SiGe:C), which is grown over retrograde doped layer 114. A set of replacement fins 120 is then formed over carbon liner 118, as shown in FIG. 7. In one embodiment, replacement fins 120 comprise a high mobility channel material (i.e., Si or Si—Ge) grown within openings 112 using CVD. Next, hardmask 108 is then removed, resulting in device 100 shown in FIG. 8.

Figure 8:
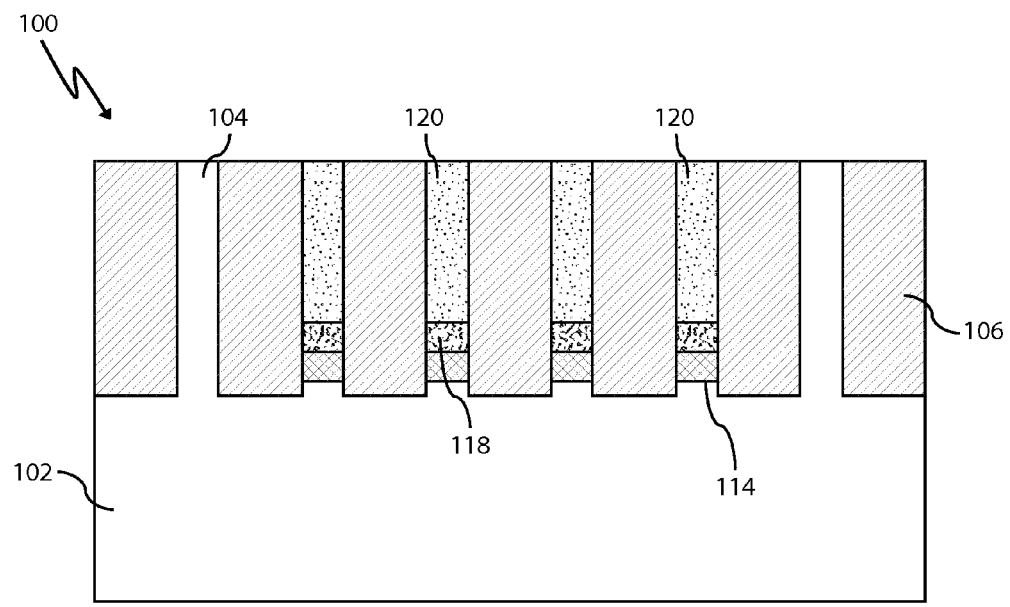
FIG. 8 shows a cross-sectional view of the removal of the hardmask according to illustrative embodiments.

Although not shown, it will be appreciated that a set of gate structures may then be formed atop device 100 shown in FIG. 8. In one embodiment, the gate structure includes a gate dielectric layer and a gate electrode. Numerous other layers may also be present, for example, capping layers, interface layers, spacer elements, and/or other suitable features. The gate dielectric layer may include dielectric material such as, silicon oxide, silicon nitride, silicon oxinitride, dielectric with a high dielectric constant (high k), and/or combinations thereof. Examples of high k materials include hafnium silicate, hafnium oxide, zirconium oxide, aluminum oxide, hafnium dioxide-alumina (HfO$_2$—Al$_2$O$_3$) alloy, and/or combinations thereof. The gate dielectric layer may be formed using processes such as, photolithography patterning, oxidation, deposition, etching, and/or other suitable processes. The gate electrode may include polysilicon, silicon-germanium, a metal including metal compounds such as, Mo, Cu, W, Ti, Ta, TiN, TaN, NiSi, CoSi, and/or other suitable conductive materials known in the art. The gate electrode may be formed using processes such as, physical vapor deposition (PVD), CVD, plasma-enhanced chemical vapor deposition (PECVD), atmospheric pressure chemical vapor deposition (APCVD), low-pressure CVD (LPCVD), high density plasma CVD (HD CVD), atomic layer CVD (ALCVD), and/or other suitable processes which may be followed, for example, by photolithography and/or etching processes.

Figure 9:
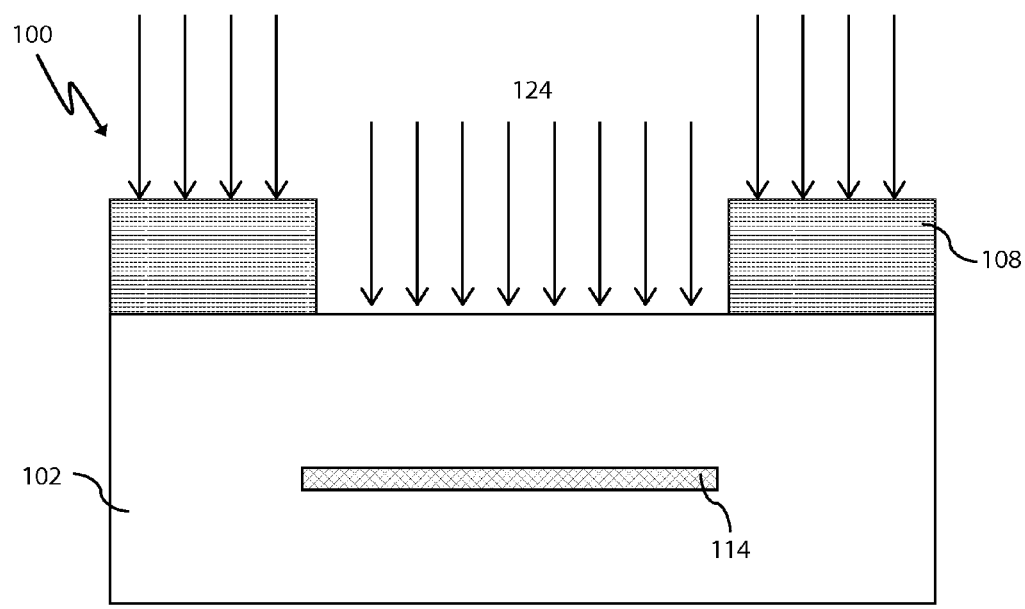
FIG. 9 shows a cross-sectional view of a counter dopant retrograde implant to form the retrograde doped layer within the substrate according to illustrative embodiments.
Figure 10:
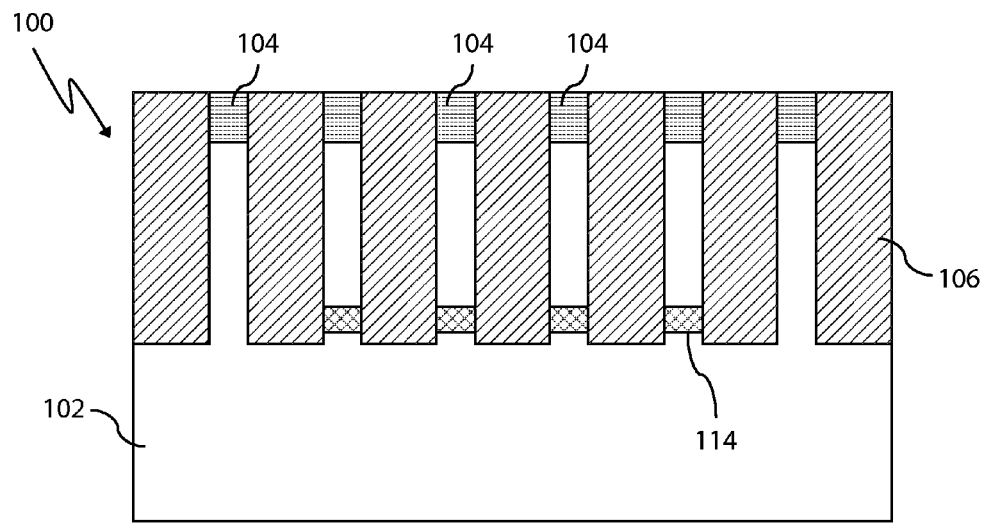
FIG. 10 shows a cross-sectional view of the set of fins formed over the substrate according to illustrative embodiments.

Turning now to FIG. 9, formation of the retrograde doped layer according to another embodiment will be described in further detail. In this embodiment, retrograde doped layer 114 is formed within substrate 102, e.g., via a counter dopant retrograde implant. In this embodiment, retrograde doped layer 114 comprises Si or Si—Ge, which is counter doped (e.g., with arsenic, antimony, or phosphorus) to ensure proper isolation. To accomplish this, hardmask 108 is formed and patterned over substrate 102, and the dopant implantation process 124 is performed. Hardmask 108 is then removed, and plurality of fins 104 are patterned over substrate 102, as shown in FIG. 10. Fins 104 may be fabricated using any suitable process including one or more photolithography and etch processes. The photolithography process may include forming a photoresist layer (resist) overlying substrate 102 (e.g., on a silicon layer), exposing the resist to a pattern, performing post-exposure bake processes, and developing the resist to form a masking element including the resist. The masking element may then be used to etch fins 104 into the silicon layer, e.g., using reactive ion etch (RIE) and/or other suitable processes.

Figure 11:
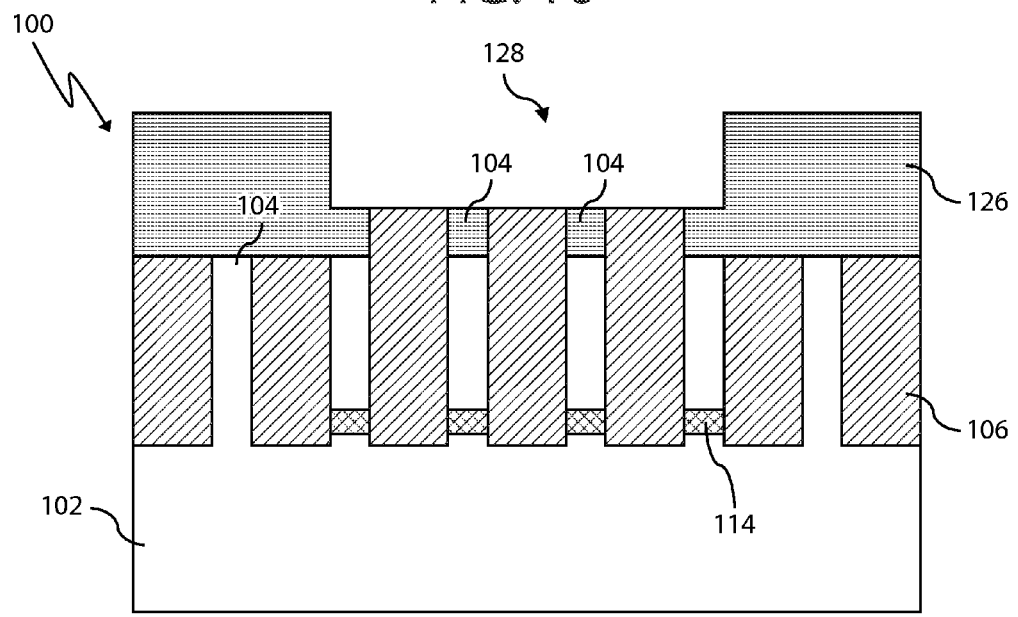
FIG. 11 shows a cross-sectional view of an opening formed in the hardmask over the set of fins according to illustrative embodiments.
Figure 12:
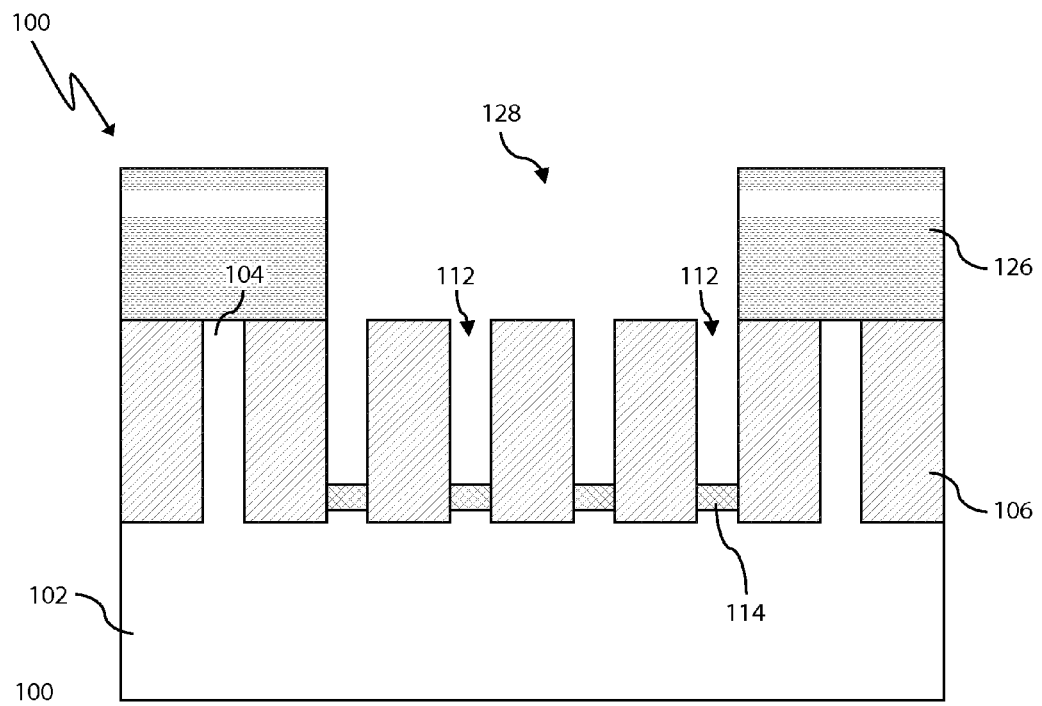
FIG. 12 shows a cross-sectional view of the removal of one or of the plurality of fins according to illustrative embodiments.
Figure 13:
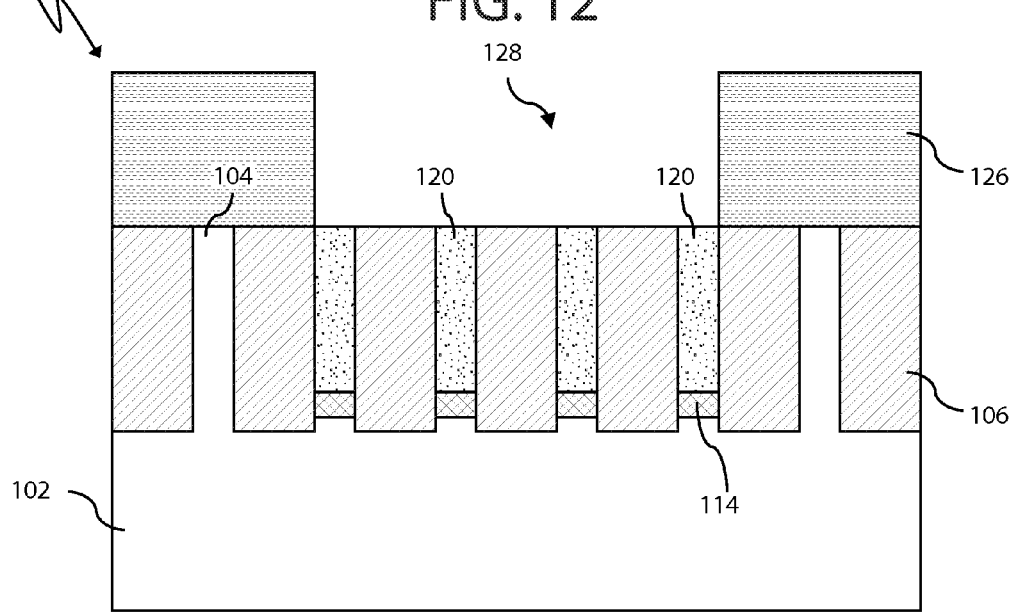
FIG. 13 shows a cross-sectional view of the formation of the set of replacement fins according to illustrative embodiments.

Next, another hardmask 126 is formed over fins 104 and patterned to form an opening 128, as shown in FIG. 11. One or more fins 104 exposed by opening 128 in hard mask 126 are then removed, as shown in FIG. 12. In this embodiment, the exposed silicon of fins 104 is removed to form a set of openings 112 in STI layer 106 and to expose retrograde doped layer 114. Next, replacement fins 120 are grown over retrograde doped layer 114 exposed by openings 112 in STI layer 106, as shown in FIG. 13. In one embodiment, replacement fins 120 comprise a high mobility channel material (e.g., Si or Si—Ge) grown within openings 112 using CVD. Hardmask 126 is then removed, to form the device shown in FIG. 14.

Figure 14:
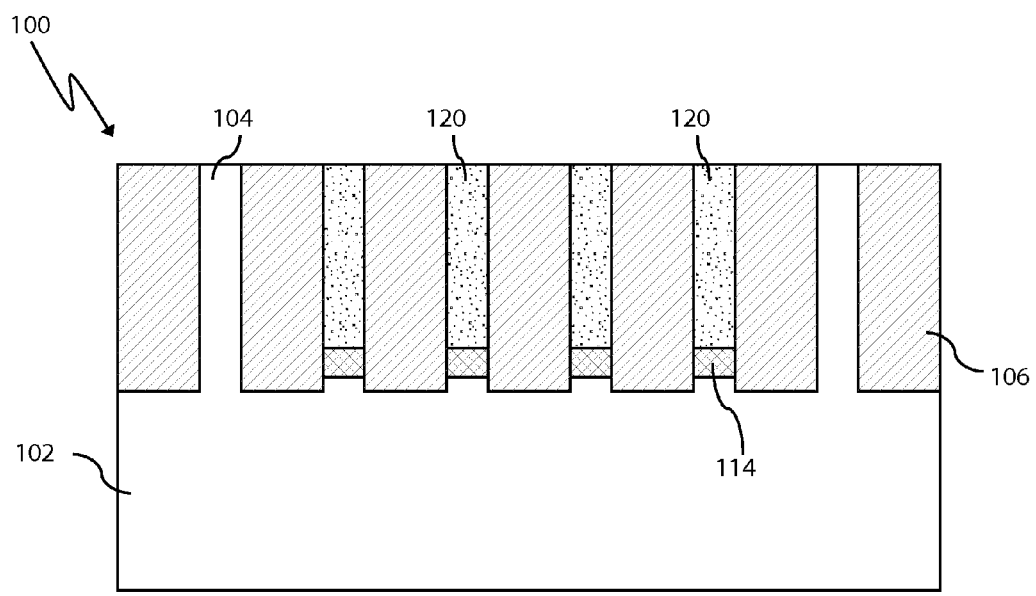
FIG. 14 shows a cross-sectional view of removal of the hard mask according to illustrative embodiments.

Although not shown, it will be appreciated that a set of gate structures may then be formed atop device 100 shown in FIG. 14. In one embodiment, the gate structure includes a gate dielectric layer and a gate electrode. Numerous other layers may also be present, for example, capping layers, interface layers, spacer elements, and/or other suitable features.

Figure 15:
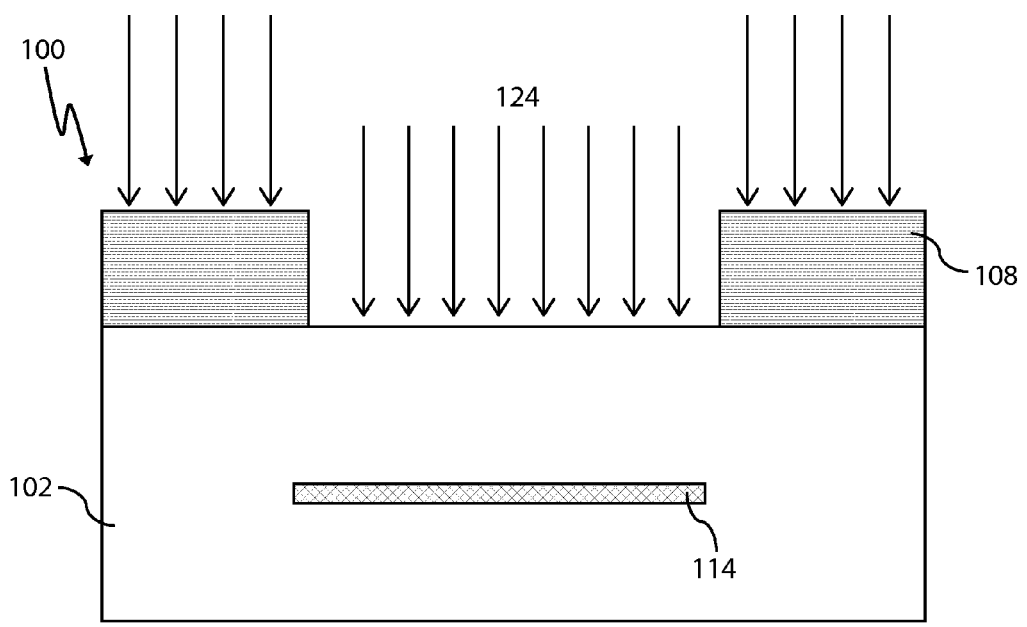
FIG. 15 shows a cross-sectional view of formation of a retrograde doped layer within the substrate according to illustrative embodiments.
Figure 16:
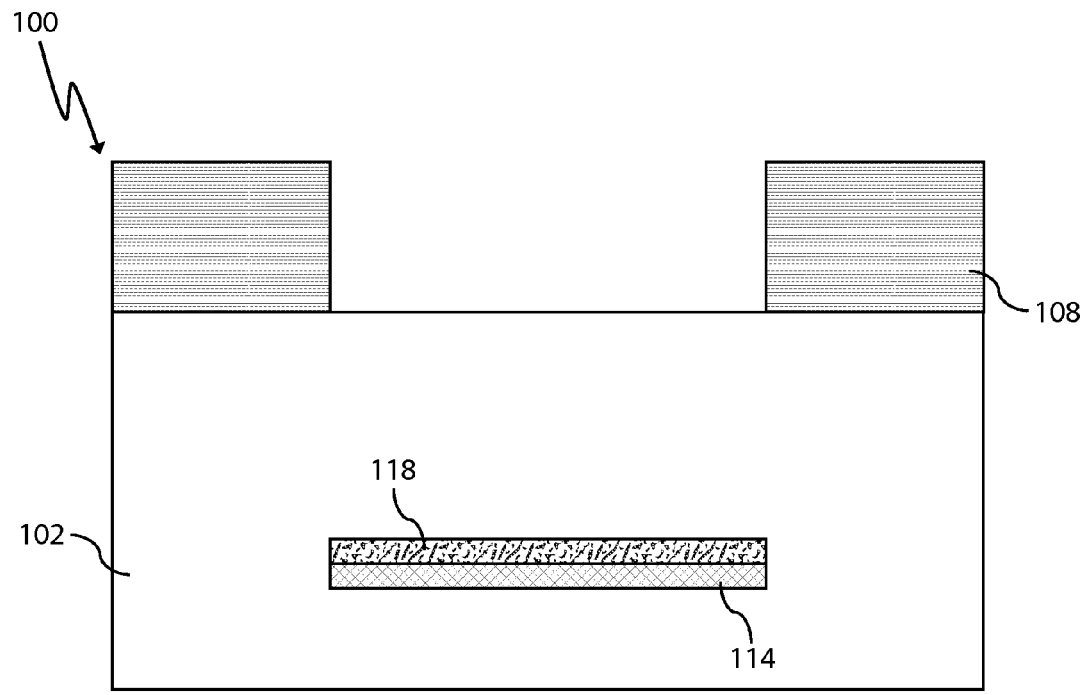
FIG. 16 shows a cross-sectional view of formation of a retrograde carbon implant to form the carbon layer over the retrograde doped layer according to illustrative embodiments.

Turning now to FIGS. 15-16, formation of carbon liner 118 over retrograde doped layer 114 according to another embodiment will be described in further detail. As shown, hardmask 108 is formed and patterned over substrate 102, and the dopant implantation process 124 is performed. In this embodiment, retrograde doped layer 114 comprises Si or Si—Ge, which is counter doped (e.g., with arsenic, antimony, or phosphorus) to ensure proper isolation. Next, as shown in FIG. 16, carbon liner 118 is formed over retrograde doped layer 114 within substrate 102 using a retrograde carbon implant. The processing steps described and shown by FIGS. 10-14 are then repeated, resulting in device 100 shown in FIG. 8.

Figure 17:
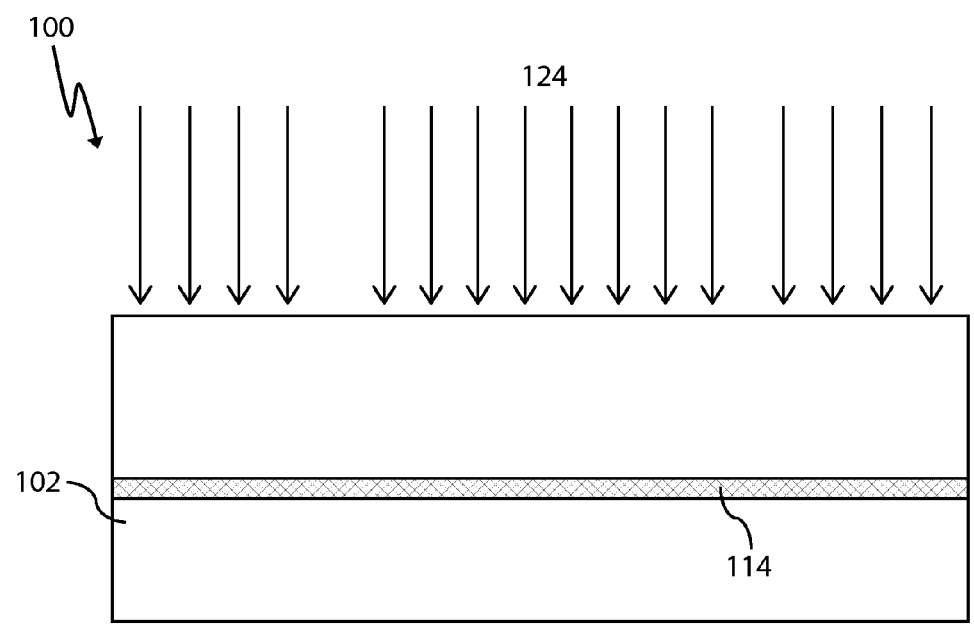
FIG. 17 shows a cross-sectional view of formation of a retrograde doped layer within the substrate according to illustrative embodiments.
Figure 18:
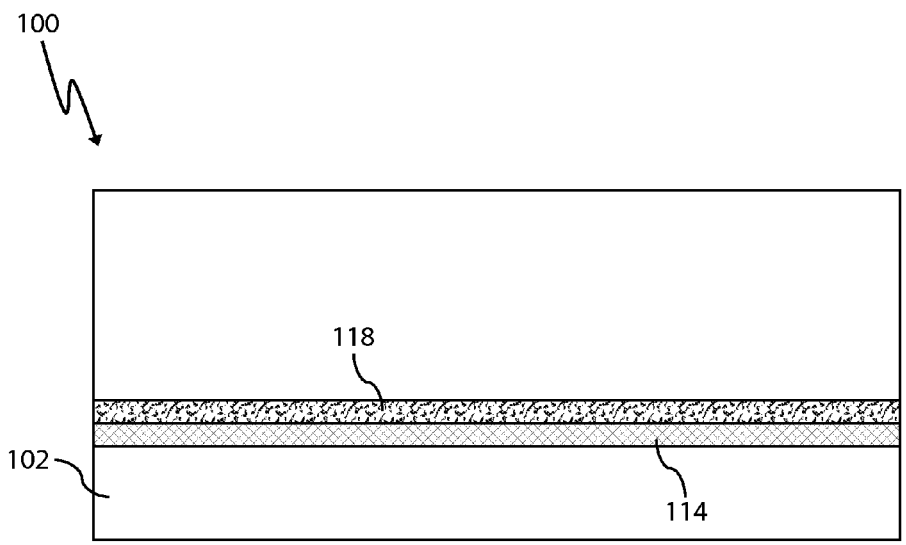
FIG. 18 shows a cross-sectional view of formation of a retrograde carbon implant to form the carbon layer over the retrograde doped layer according to illustrative embodiments.

Turning now to FIGS. 17-18, formation of carbon liner 118 over retrograde doped layer 114 according to another embodiment will be described in further detail. As shown, the dopant implantation process 124 is performed over all of substrate 102. As a result retrograde doped layer 114 extends the entire width of substrate 102. In this embodiment, retrograde doped layer 114 comprises Si or Si—Ge, which is counter doped (e.g., with arsenic, antimony, or phosphorus) to ensure proper isolation. Next, as shown in FIG. 18, carbon liner 118 is formed over retrograde doped layer 114 within substrate 102 using a retrograde carbon implant.

Figure 19:
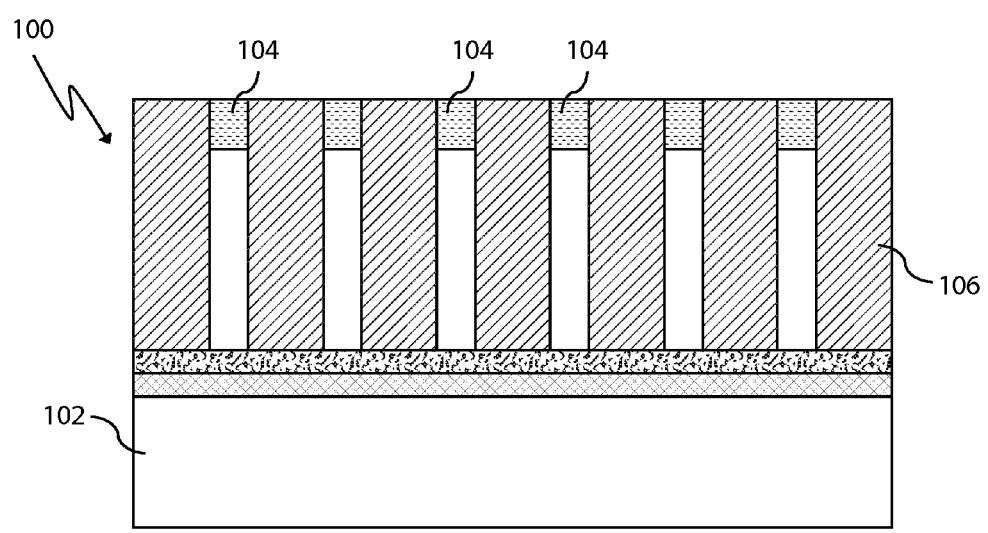
FIG. 19 shows a cross-sectional view of the set of fins formed over the substrate according to illustrative embodiments.

Next, plurality of fins 104 are patterned over substrate 102, as shown in FIG. 19. Fins 104 may be fabricated using any suitable process including one or more photolithography and etch processes. The photolithography process may include forming a photoresist layer (resist) overlying substrate 102 (e.g., on a silicon layer), exposing the resist to a pattern, performing post-exposure bake processes, and developing the resist to form a masking element including the resist. The masking element may then be used to etch fins 104 into the silicon layer, e.g., using reactive ion etch (RIE) and/or other suitable processes.

Figure 20:
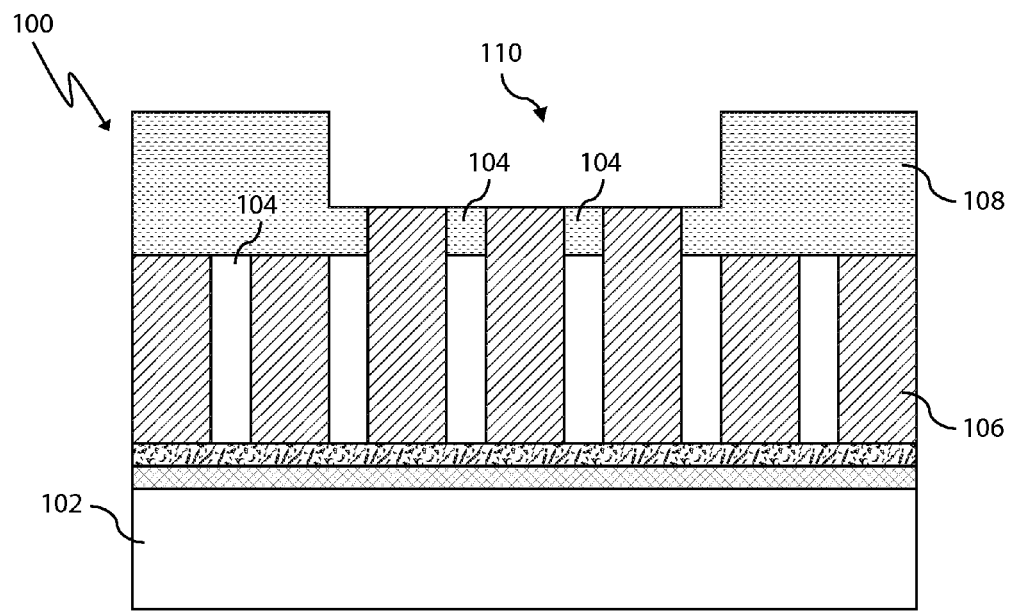
FIG. 20 shows a cross-sectional view of an opening formed in the hardmask over the set of fins according to illustrative embodiments.
Figure 21:
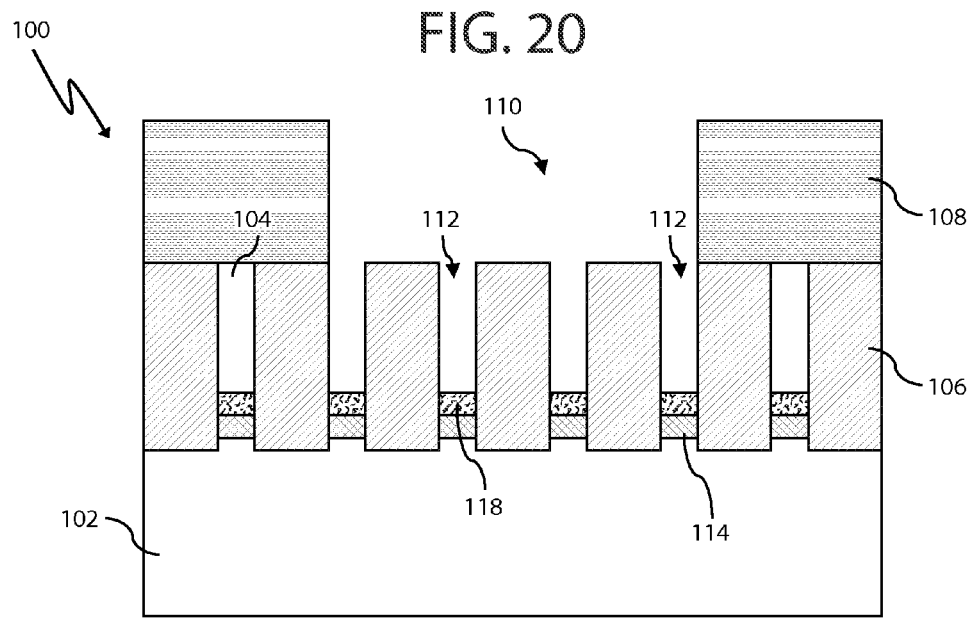
FIG. 21 shows a cross-sectional view of the removal of one or of the plurality of fins according to illustrative embodiments.
Figure 22:
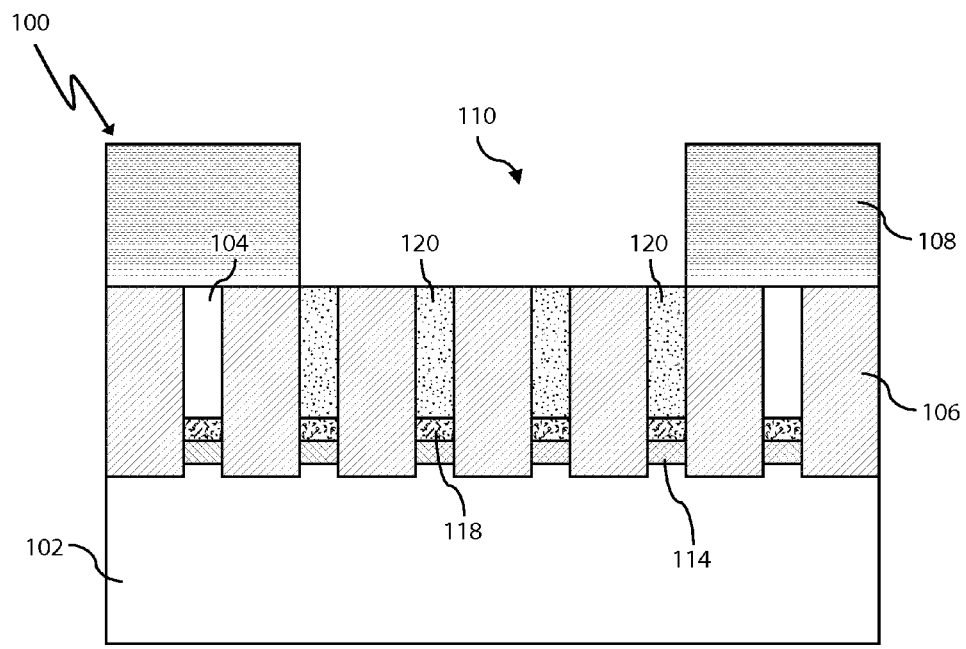
FIG. 22 shows a cross-sectional view of the formation of the set of replacement fins according to illustrative embodiments.

Next, hardmask 108 is formed over fins 104 and patterned to form opening 110, as shown in FIG. 20. One or more fins 104 exposed by opening 110 in hard mask 110 are then removed, as shown in FIG. 21. In this embodiment, the exposed silicon of fins 104 is removed to form a set of openings 112 in STI layer 106 and to expose carbon liner 118 and retrograde doped layer 114. Next, replacement fins 120 are grown over retrograde doped layer 114 exposed by openings 112 in STI layer 106, as shown in FIG. 22. In one embodiment, replacement fins 120 comprise a high mobility channel material (e.g., Si or Si—Ge) grown within openings 112 using CVD. Hardmask 108 is then removed (not shown). As a result, device 100 comprises a set of silicon fins 104 adjacent replacement fins 120, set of silicon fins 104 formed atop retrograde doped layer 114 and carbon liner 118. In this embodiment, the same retrograde well is used for both Silicon PFETS and SiGe PFETS. They are formed on the same substrate 102 with the same retrograde well implants.

Figure 23:
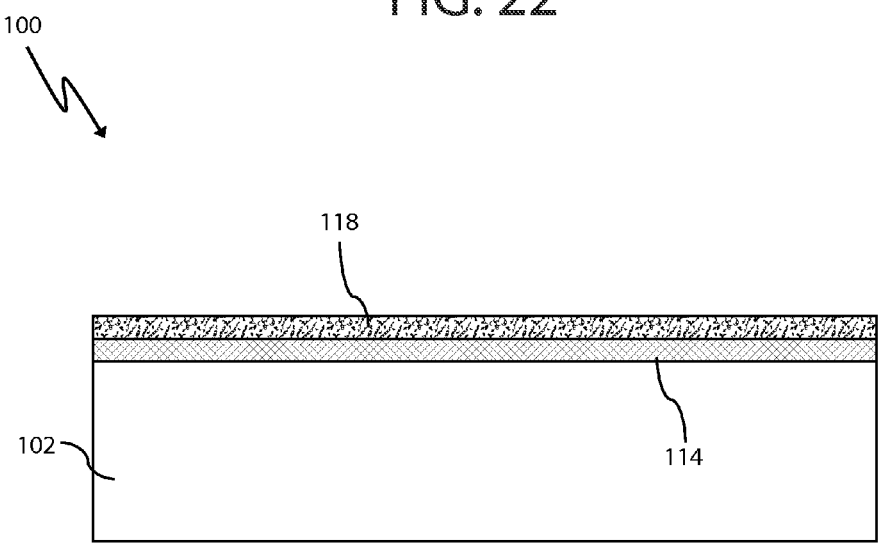
FIG. 23 shows a cross-sectional view of in situ formation of a retrograde carbon implant to form the carbon layer over the retrograde doped layer according to illustrative embodiments.
Figure 24:
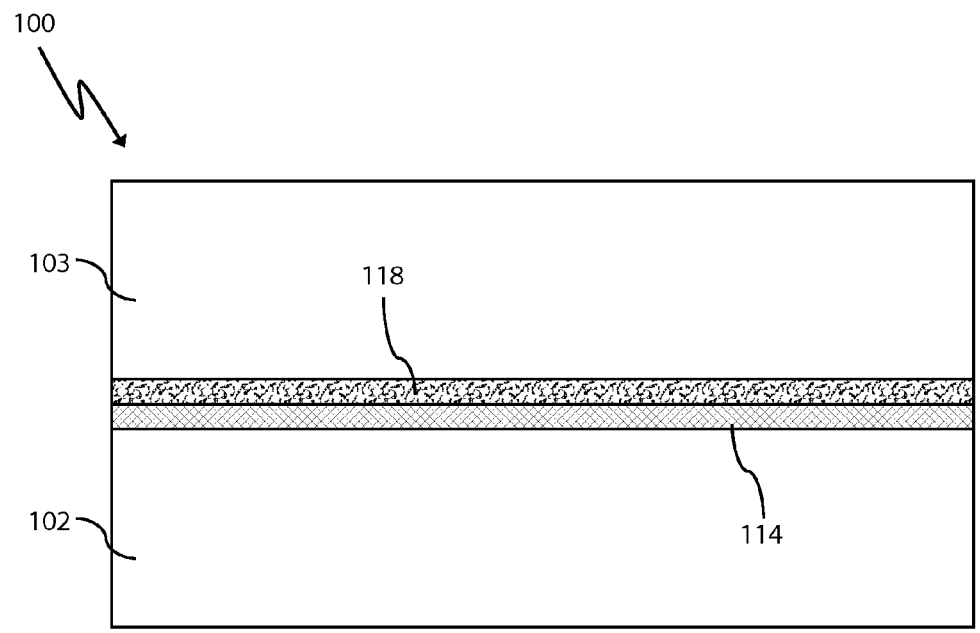
FIG. 24 shows a cross-sectional view of a silicon layer formed over the carbon layer and the retrograde doped layer according to illustrative embodiments.

Turning now to FIGS. 23-24, formation of carbon liner 118 over retrograde doped layer 114 according to another embodiment will be described in further detail. In this embodiment, retrograde doped layer 114 is grown over substrate 102 and doped using an in situ doping process. As shown, in situ growth takes place over all of substrate 102, resulting in retrograde doped layer 114 extending the entire width of substrate 102. In one embodiment, retrograde doped layer 114 comprises Si/Si—Ge, which is counter doped, e.g., with arsenic, antimony, or phosphorous, to ensure proper isolation.

As further shown in FIG. 23, carbon liner 118 is formed over retrograde doped layer 114. In one embodiment, carbon liner 118 comprises Silicon Germanium:Carbon (SiGe:C), which is grown over retrograde doped layer 114. A silicon layer 103 is then formed over carbon liner 118, as shown in FIG. 24.

Figure 25:
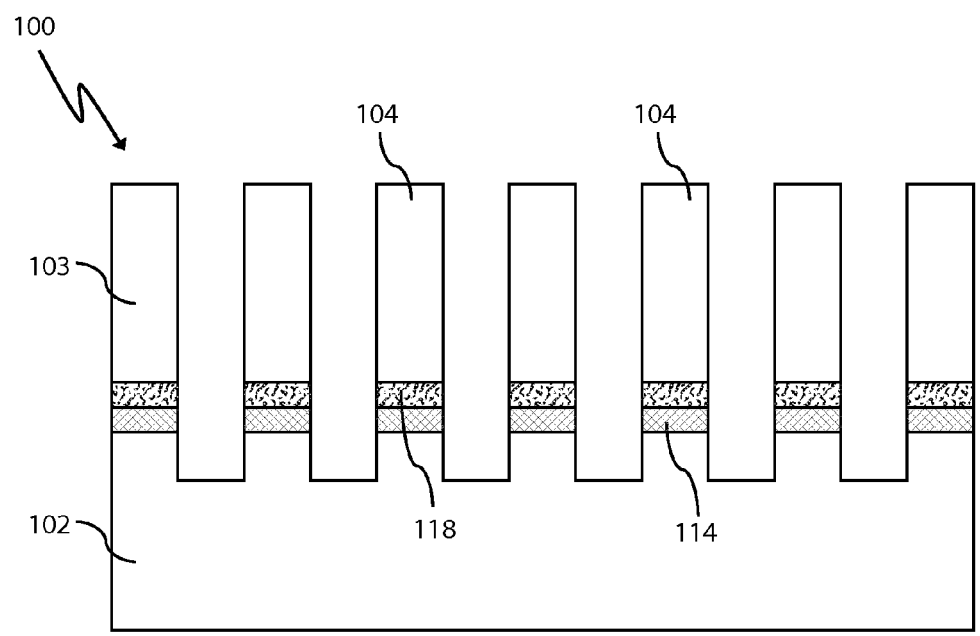
FIG. 25 shows a cross-sectional view of the set of fins patterned over the substrate according to illustrative embodiments.
Figure 26:
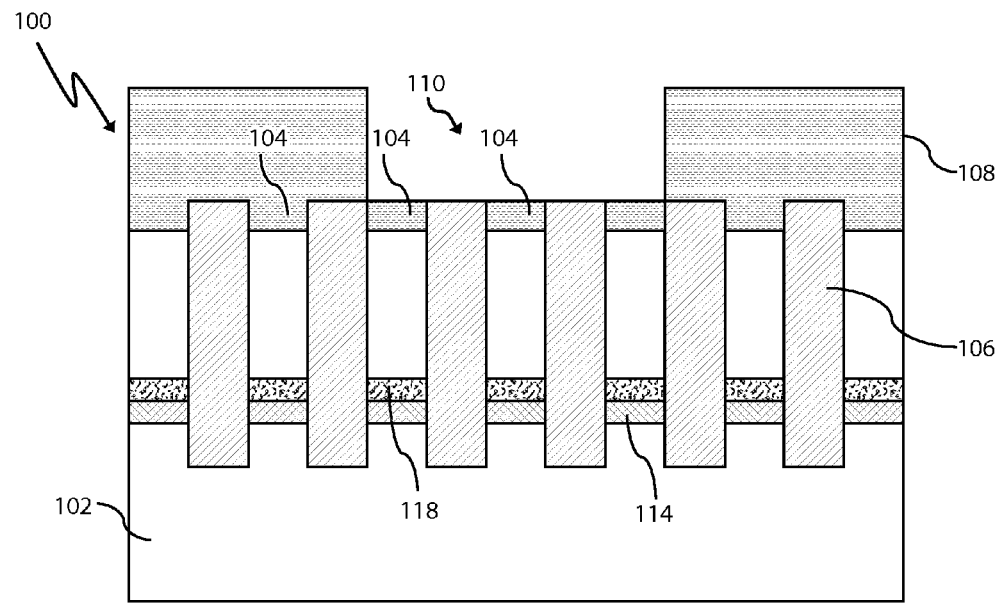
FIG. 26 shows a cross-sectional view of a source trench isolation material deposition according to illustrative embodiments.
Figure 27:
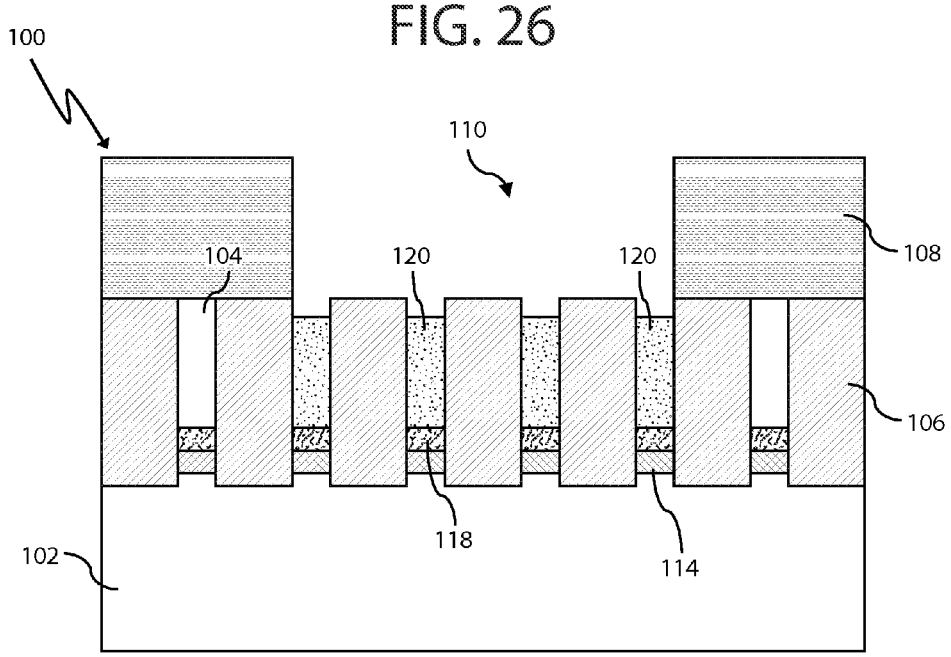
FIG. 27 shows a cross-sectional view of the formation of the set of replacement fins according to illustrative embodiments.

Next, as shown in FIG. 25, plurality of fins 104 are patterned in silicon layer 103, carbon layer 118, retrograde doped layer 114 and substrate 102. STI layer 106 is then deposited over silicon layer 103, as shown in FIG. 26, and replacement fins 120 are formed over carbon liner 118, as shown in FIG. 27. As a result, device 100 comprises a set of silicon fins 104 adjacent replacement fins 120, set of silicon fins 104 formed atop retrograde doped layer 114 and carbon liner 118. In this embodiment, the same retrograde well is used for both Silicon PFETS and SiGe PFETS. They are formed on the same substrate 102 with the same retrograde well implants.

In various embodiments, design tools can be provided and configured to create the datasets used to pattern the semiconductor layers as described herein. For example data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided device isolation in a complimentary metal-oxide fin field effect transistor. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:
1. A semiconductor device comprising:
   a retrograde doped layer formed over a substrate, the retrograde doped layer comprising one of: doped silicon (Si), and doped silicon-germanium (Si—Ge);
   a set of replacement fins formed over the retrograde doped layer, each of the set of replacement fins comprising a high mobility channel material; and a carbon liner between the retrograde doped layer and the set of replacement fins.

2. The semiconductor device according to claim 1, further comprising a set of silicon fins adjacent the set of replacement fins, the set of silicon fins formed over the retrograde doped layer.

3. The semiconductor device according to claim 1, wherein the high mobility channel material comprises at least one of: Si, and Si—Ge.

* * * * *